(12) United States Patent
Kim et al.

(10) Patent No.: US 6,902,261 B2
(45) Date of Patent: Jun. 7, 2005

(54) METHOD AND APPARATUS FOR BONDING A FLEXIBLE PRINTED CIRCUIT CABLE TO AN INK JET PRINT HEAD ASSEMBLY

(75) Inventors: Jeong-seon Kim, Gyeonggi-do (KR); Seo-hyun Cho, Gyeonggi-do (KR); Dae-woo Son, Chungcheongnam-do (KR); Sa-yoon Kang, Seoul (KR); Myung-song Jung, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 98 days.

(21) Appl. No.: 10/388,422

(22) Filed: Mar. 17, 2003

(65) Prior Publication Data
US 2003/0214558 A1 Nov. 20, 2003

(30) Foreign Application Priority Data
May 20, 2002 (KR) ........................................ 2002-27867

(51) Int. Cl.$^7$ ................................................. B41J 2/05
(52) U.S. Cl. ........................................................ 347/64
(58) Field of Search ............................... 347/20, 1, 5, 7, 347/9, 37, 40–46, 71, 72, 49, 62, 61, 54, 50, 64, 63

(56) References Cited

U.S. PATENT DOCUMENTS

| | | | |
|---|---|---|---|
| 4,635,073 A | 1/1987 | Hanson | |
| 5,668,700 A | 9/1997 | Tagusa et al. | |
| 6,126,271 A | 10/2000 | Terui | |
| 6,290,331 B1 | 9/2001 | Agarwal et al. | |
| 6,305,785 B1 * | 10/2001 | Hosaka et al. | 347/49 |

FOREIGN PATENT DOCUMENTS

| | | |
|---|---|---|
| EP | 32437 A1 | 7/1981 |
| EP | 593175 A2 | 4/1994 |
| EP | 1094029 A1 | 4/2001 |
| JP | 2-135797 | 5/1990 |
| JP | 10-58686 | 3/1998 |

OTHER PUBLICATIONS

Notice to Submit Response (from Korean Patent Office).
EP Search Report, Application No. EP 0226 7528, Mar. 12, 2004.

* cited by examiner

Primary Examiner—Raquel Yvette Gordon
(74) Attorney, Agent, or Firm—Staas & Halsey LLP (57) ABSTRACT

A bonding apparatus and method thereof to bond the bonding portions of an FPC cable to pads of a print head die in order to electrically connect the print head die of an ink jet print head assembly include a stage and a bonding tool. The print head die includes resistive heaters, signal lines connected to the resistive heaters, and electrical pads to connect the signal lines to an outside of the print head die to the FPC cable having conductors having bonding portions facing the pads. The print head die is supported on the stage with the pads facing upward. The bonding tool includes a tip that press bonding portions of the FPC cable against corresponding pads of the print head die placed on the stage, and heats the bonding portions in contact with the pads to bond the bonding portion to the pads. The bonding tool includes a protrusion positioned to align with a position beyond the boundary of the print head die, and that extends lower than the tip, such that, during the bonding operation, the protrusion bends the FPC cable downward. In addition, during the bonding operation, the upper protective film of the FPC cable around the bonding portions are left intact to provide protective layer over the resulting bond, and thus results in less amount of encapsulation over the bond.

30 Claims, 11 Drawing Sheets

METHOD AND APPARATUS FOR BONDING A FLEXIBLE PRINTED CIRCUIT CABLE TO AN INK JET PRINT HEAD ASSEMBLY

CROSS-REFERENCE TO RELATED APPLICATIONS

This application claims the benefit of Korean Application No. 2002-27867 filed May 20, 2002, in the Korean Intellectual Property Office, the disclosure of which is incorporated herein by reference.

BACKGROUND OF THE INVENTION

1. Field of the Invention

The present invention relates to a method for bonding a flexible printed circuit (FPC) cable to an ink jet print head assembly, and an apparatus adopting the method.

2. Description of the Related Art

In an ink jet head adopting an electro-thermal transducing technique to discharge ink droplet using bubbles obtained by instantaneously heating ink, a print head die having heaters and nozzles thereon is included. The print head die also includes a plurality of signal lines electrically connected to the heaters, and a plurality of electric contact pads arranged on the peripheral edges of the print head die in an inline configuration in order to allow the signal lines to be coupled to an external circuit.

The pads are connected to FPC cable on which a plurality of conductors corresponding to the pads are arranged side by side. The pads are bonded to the conductors by thermo-sonic bonding.

U.S. Pat. Nos. 4,635,073 and 6,126,271 each disclose a method of bonding the pads to conductors using a thermo-sonic bonding technique. Due to the high vibration energy required for the bonding of each conductor/pad pair, simultaneous bonding of all conductor/pad pairs may have detrimental effect on the integrity of the print head die and any other parts of the ink jet head. Thus, the thermo-sonic bonding technique is a single point bonding method to bond a single conductor to a single pad at a time. In a conventional method shown in FIG. 1, a conductor 3 is brought into contact with a pad 2 installed on a print head die 1, and then a thermo-sonic bonding tool 4 applies pressure and high frequency (ultrasonic) vibration to the conductor 3 one conductor at a time to permanently bond to the pad 2. The remaining pads and conductors are sequentially bonded together one at a time. According to the conventional sequential bonding method, depending on the number of conductor/pad pairs, the bonding process takes a significant amount of time.

Figure 1:
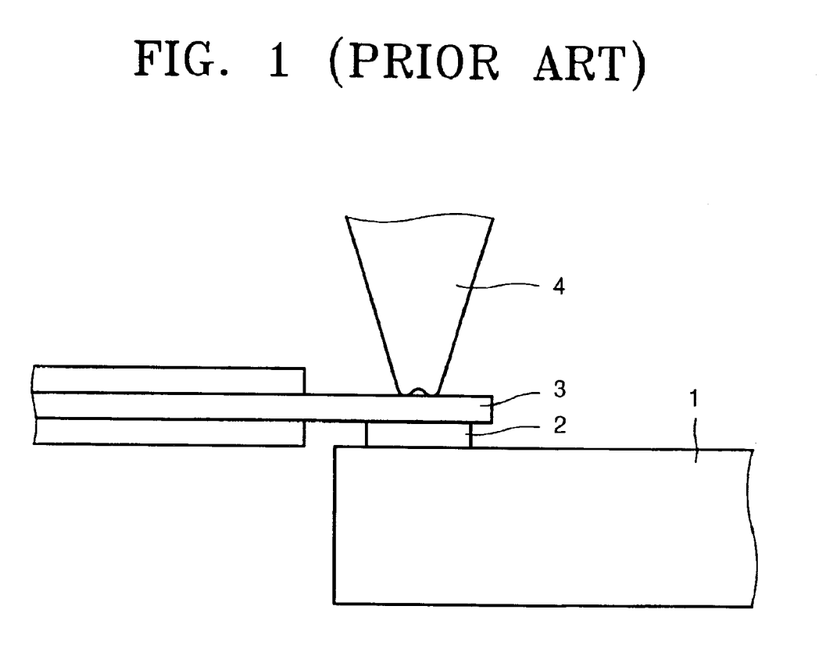
FIG. 1 is a schematic diagram illustrating a method of bonding a flexible printed circuit (FPC) cable of an ink jet print head assembly using a conventional thermo-sonic welding technique.

In addition, the vibration energy generated by ultrasonic frequency may deform the portion of the conductor 3 where the energy is focused, decreasing the rigidity of the bond, and, as a result, the conductor 3 may easily become separated from the pad.

Moreover, after a conventional bonding process described above, a considerable length of the FPC cable is left to extend above the print head die, which blocks the travel path of a wiper in the maintenance station of the ink jet printing apparatus. Also, when the wiper travels beyond the peripheral boundary of the print head die, the wiper continues to press on the extended portion of the FPC cable, resulting in an unnecessary shear force being applied to the bond between the print head die and the FPC cable.

Furthermore, during a conventional bonding process, the conductor of the FPC cable is completely exposed, i.e., the protective and/or insulation film covering the conductor is completely removed near the bond, requiring an excessive amount of encapsulation over the bond to insulate the exposed upper surface of the conductor. The excessive encapsulation adds height over the bond, and thus also reduces the clearance for a wiper to travel, and increases the distance the ink droplets must travel before landing on the surface of the print medium, e.g., a sheet of paper.

SUMMARY OF THE INVENTION

To solve the above-described problems, it is an aspect of the present invention to provide an ink jet print head assembly and a method and apparatus for bonding a flexible printed circuit (FPC) cable to an ink jet print head assembly, in which the time spent to bond a conductor is decreased.

In accordance with another aspect of the present invention, there is provided an ink jet print head assembly and a method and apparatus for bonding an FPC cable to an ink jet print head assembly, in which the portion where a conductor and a pad are joined together provides an increased structural intensity.

In accordance with still another aspect of the present invention, there is provided an ink jet print head assembly and a method and apparatus for bonding an FPC cable to an ink jet print head assembly, in which a printing quality is increased by a reduction in an flying distance of droplet.

In accordance with an aspect of the present invention, there is provided a method of bonding an FPC cable to an ink jet print head assembly. The method includes: preparing a print head die of the ink jet print head assembly, the print head die having resistive heaters, signal lines connected to the resistive heaters, and electrical pads for connecting the signal lines to the outside of the print head die; preparing the FPC cable having conductors having bonding portions, wherein each of the conductors corresponds to each of the pads, respectively; mounting the print head die on a stage of the bonding apparatus to combine the print head die with the FPC cable; arranging the FPC cable on the print head die so that the bonding portions of the conductors face corresponding one of the pads; pressing all of the conductors down on the corresponding pads at a time; bending the FPC cable when the bonding apparatus bonds the conductors to the pads, to place the bent portion of the FPC cable at a rear part of the print head die; and heating all of the conductors to bond the conductors to the pads.

In accordance with an aspect of the present invention, there is provided another method of bonding an FPC cable to an ink jet print head assembly. The method includes: preparing a print head die of the ink jet print head assembly, the print head die having resistive heaters, signal lines connected to the resistive heaters, and electrical pads to connect the signal lines to the outside; preparing the FPC cable having conductors with bonding portions facing the pads; completely covering an upper surface of the conductors using an upper protect film; covering a lower surface of the conductors using a lower protect film except for a bonding portion facing the pads; mounting the print head die on a stage of a bonding apparatus to combine the print head die with the FPC cable; arranging the FPC cable on the print head die so that the bonding portions of the conductors face corresponding one of the pads; pressing all the conductors down on the corresponding pads at a time; and heating all the conductors to bond the conductors to the pads.

According to an aspect of the present invention, in the above method, there is further provided bringing the bonding portions of the conductors in contact with the corresponding pads at both edges of the bonding apparatus.

In accordance with an aspect of the present invention, in the above method, there is further provided bending the FPC cable when the bonding apparatus bonds the conductors to the pads, to place the bent portion of the FPC cable at a location proximate to the bonded portion where a bent portion thereof is placed at a rear of the print head die.

In accordance with an aspect of the bonding method, the bonding is performed with a bump interposed between a bonding portion of the pads and the corresponding conductors. The lower protect film may have an aperture facing each of the pads. A bump is inserted into the aperture, and the bonding portion of a conductor is electrically connected to a corresponding pad.

In accordance with an aspect of the present invention, there is provided a bonding apparatus to bond the bonding portions of an FPC cable to pads of a print head die in order to electrically connect the print head die of an ink jet print head assembly, the print head die having resistive heaters, signal lines connected to the resistive heaters, and electrical pads to connect the signal lines to an outside of the print head die to the FPC cable having conductors having bonding portions facing the pads. The bonding apparatus includes: a stage on which the print head die is mounted comprising the pads facing upward; and a bonding tool moving up and down over the stage to press all the bonding portions down on corresponding pads and to heat all the bonding portions in contact with the pads to bond all the bonding portion to the pads using a hot pressure welding technique at one time, wherein the bonding tool has a protruding extension to bend the FPC cable beside each edge of the print head die so that the FPC cable is placed from an upper surface level of the print head die to a position at a rear of the print head die.

In the bonding apparatus, the bonding tool has a tip to bring the bonding portions of the conductors of the FPC cable in contact with corresponding pads. The tip protrudes from both edges of the bonding tool to bond opposite conductors to corresponding opposite pads from the pads formed on both edges of the print head die.

In accordance with an aspect of the present invention, the bonding tool has a dam-shaped tip that covers the pads formed on the print head die. Also, the dam-shaped tip is symmetrically formed at both ends of the bonding tool so that the dam-shaped tip covers the pads formed along both edges of the print head die. Furthermore, the bonding tool has a partial depressing protrusion corresponding to the pads.

In accordance with an aspect of the present invention, there is provided an ink jet print head assembly including an ink jet print head chip and an FPC cable. The inkjet print head chip has a plurality of nozzles, from each of which an ink droplet is ejected when a corresponding respective one of a plurality of heating elements disposed within said ink jet print head assembly chip is active. The inkjet print head chip further has a plurality of bonding pads disposed thereon to provide electrical connections to said plurality of heating elements from an external electrical signal source. The FPC cable has a plurality of conductors and upper and lower films to protect the conductors. Each of the conductors has a bonding portion to be bonded to corresponding one of the pads. At least one of the conductors is hot pressure welded to at least one of the binding pads to form a bonded connection. The upper film completely covers the upper surface of the conductors, and the lower film covers the lower surface of the conductors except for the bonding portion facing the pads.

In the above-described ink jet print head assembly, the FPC cable is bent downward at a location proximate to the bonded portion where a bent portion thereof is placed at a rear of the print head die. The lower film has a window formed directly over the corresponding pads to allow the corresponding conductors to contact the pad.

According to an aspect of the present invention, a conductive bump is interposed between the bonding portion of the conductors and the corresponding pads.

In accordance with an aspect of the present invention, there is provided another ink jet print head assembly including an inkjet print head chip and an FPC cable. The inkjet print head chip has a plurality of nozzle, from each of which an ink droplet is ejected when a corresponding respective one of a plurality of heating elements disposed within said ink jet print head assembly chip is active. The inkjet print head chip further includes a plurality of bonding pads disposed thereon to provide electrical connections to said plurality of heating elements from an external electrical signal source. The FPC cable has a plurality of conductors, among which at least one conductor is hot pressure welded to at least one of said plurality of binding pads to form a bonded connection. The FPC cable is bent downward at a location proximate to the bonded portion where a bent portion thereof is placed at a rear of the print head die.

These together with other aspects and advantages which will be subsequently apparent, reside in the details of construction and operation as more fully hereinafter described and claimed, reference being had to the accompanying drawings forming a part thereof, wherein like numerals refer to like parts throughout.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

Hereinafter, embodiments of the present invention will be described in detail with reference to the attached drawings. The present invention may, however, be embodied in many different forms and should not be construed as being limited to the embodiments set forth herein; rather, these embodiments are provided so that the present disclosure will be thorough and complete, and will fully convey the concept of the invention to those skilled in the art. An ink jet print head assembly is not described but will be understood through the description of bonding methods and apparatuses according to the present invention.

According to the principles of one aspect of the present invention, a hot pressure welding (thermo-pressure bonding) using local compressive energy may be adopted. In the hot pressure welding, a fragile print head die is not subjected to vibrational impact, so that simultaneous bonding with respect to several pads is possible in contrast with thermo-sonic bonding. However, there are other aspects of the present invention that may be implemented in ink jet head assembly regardless of the particular bonding method, i.e., the thermo-pressure and/or the thermo-sonic bonding.

Figure 2:
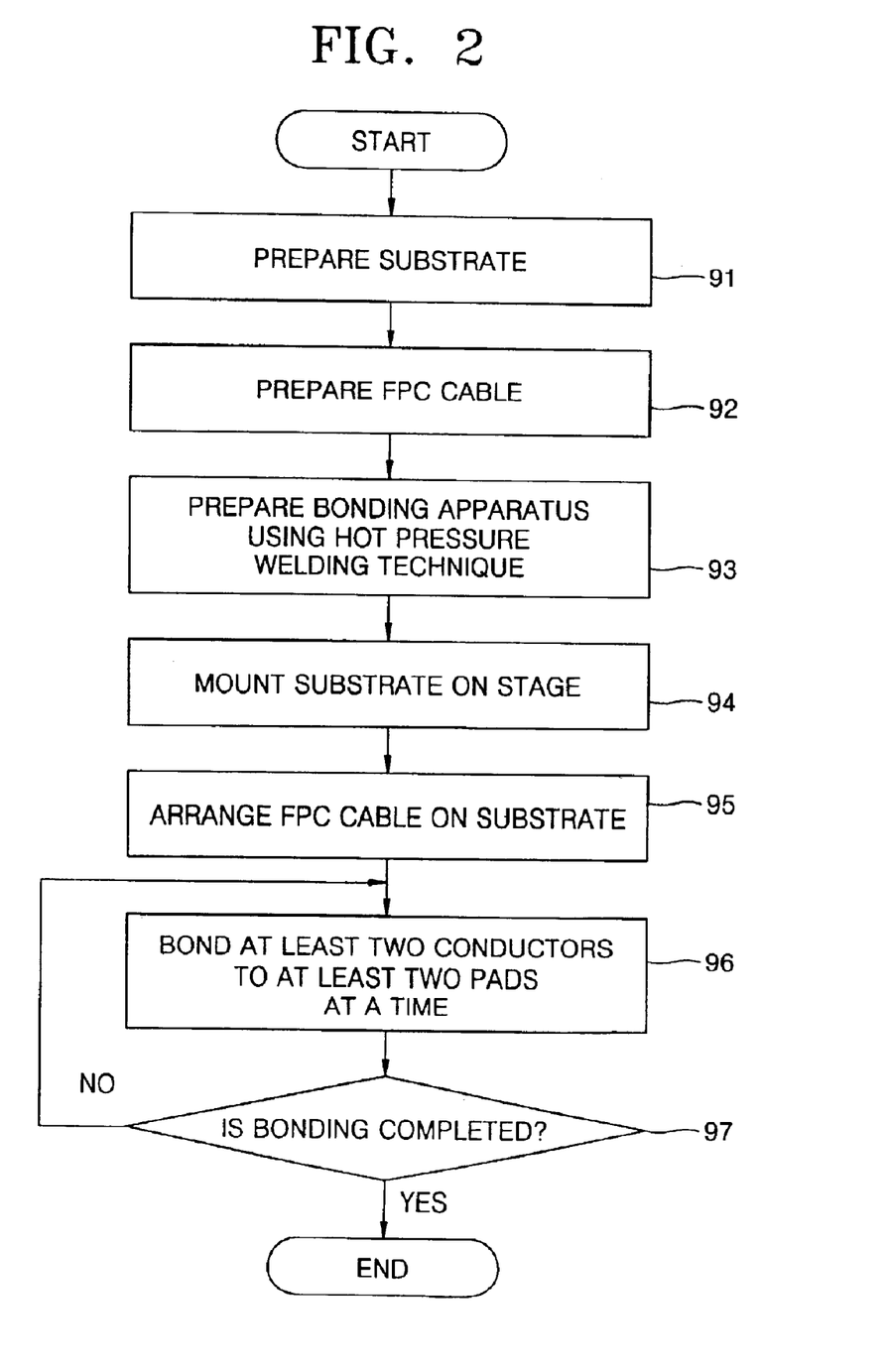
FIG. 2 is a flowchart illustrating an exemplary embodiment of a method of bonding the FPC cable of the ink jet print head assembly according to the principles of the present invention.

FIG. 2 is a flowchart illustrating an exemplary embodiment of a bonding method according to the principles of the present invention. Referring to FIG. 2, at operation 91, a print head die for an ink jet print head assembly is prepared. Then, at operation 92, a flexible printed circuit (FPC) cable to be bonded to the print head die is prepared. Next, at operation 93, a bonding apparatus to bond the conductors of the FPC cable to pads on the print head die using the hot pressure welding (i.e., thermo-pressure bonding) technique is prepared. Thereafter, at operation 94, the print head die is mounted on a stage (i.e., a stage 50 of FIG. 3) of the bonding apparatus. Subsequently, at operation 95, the FPC cable is arranged on the print head die. Next, at operation 96, a bonding tool of the bonding apparatus bonds the conductors of the FPC cable to the pads on the print head die using the hot pressure welding technique. At this time, at least two conductors are bonded to at least two pads. The bonding method repeats and returns to operation 96, until all of the pads on the print head die are bonded to the corresponding conductors. However, all of the pads can be simultaneously bonded to the corresponding conductors at one time.

Figure 3:
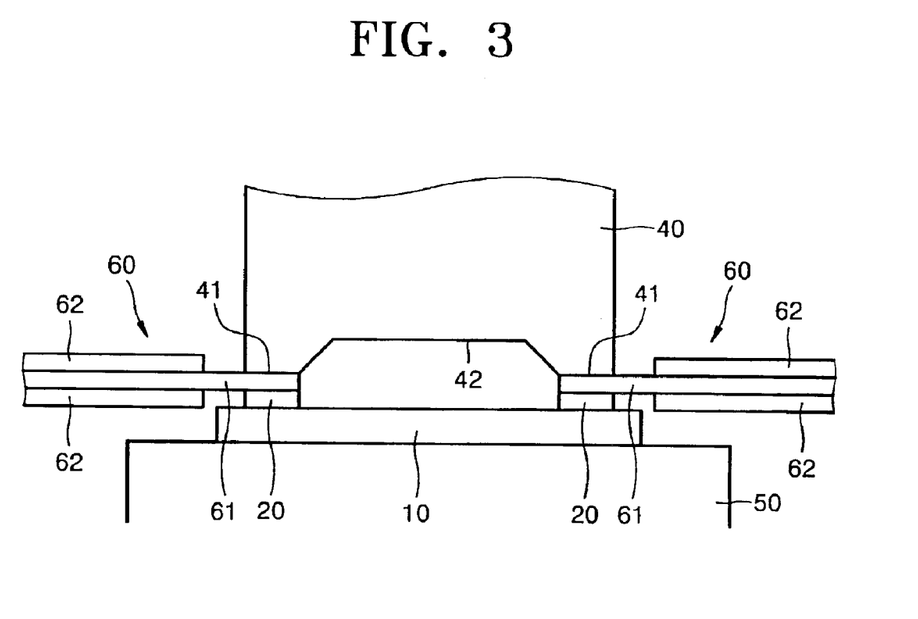
FIG. 3 is a schematic structure diagram of an exemplary embodiment of a bonding apparatus according to the principles of the present invention, illustrating a first exemplary embodiment of a method of bonding the FPC cable of the ink jet print head assembly according to the principles of the present invention.

FIG. 3 is a schematic structure diagram of the bonding apparatus according to an aspect of the present invention, in which the bonding tool bonds the FPC cable to the print head die using a first exemplary embodiment of a bonding method according to the principles of the present invention. Referring to FIG. 3, a print head die 10 to be bonded, is mounted on a stage 50 of the bonding apparatus adopting the hot pressure welding technique. While, for brevity, FIG. 3 shows only the electric pads 20, the print head die 10 may also include other elements, e.g., one or more nozzles through which ink droplets may be ejected, a plurality of resistive heaters, a plurality of signal lines connected to the heaters Conductors 61 of a FPC cable 60 are placed on the pads 20 and depressed by a tip 41 of a bonding tool 40. Although not shown in FIG. 3, a solder (or other conductive material, e.g., gold or the like) bump or ball may be disposed on the pad 20, which melts due to the heat applied through the bonding apparatus 40, permanently bonding the conductor 61 to the pad 20. The unexposed portions of the conductors 61 are protected by upper and lower insulation/protect films 62.

Figure 4:
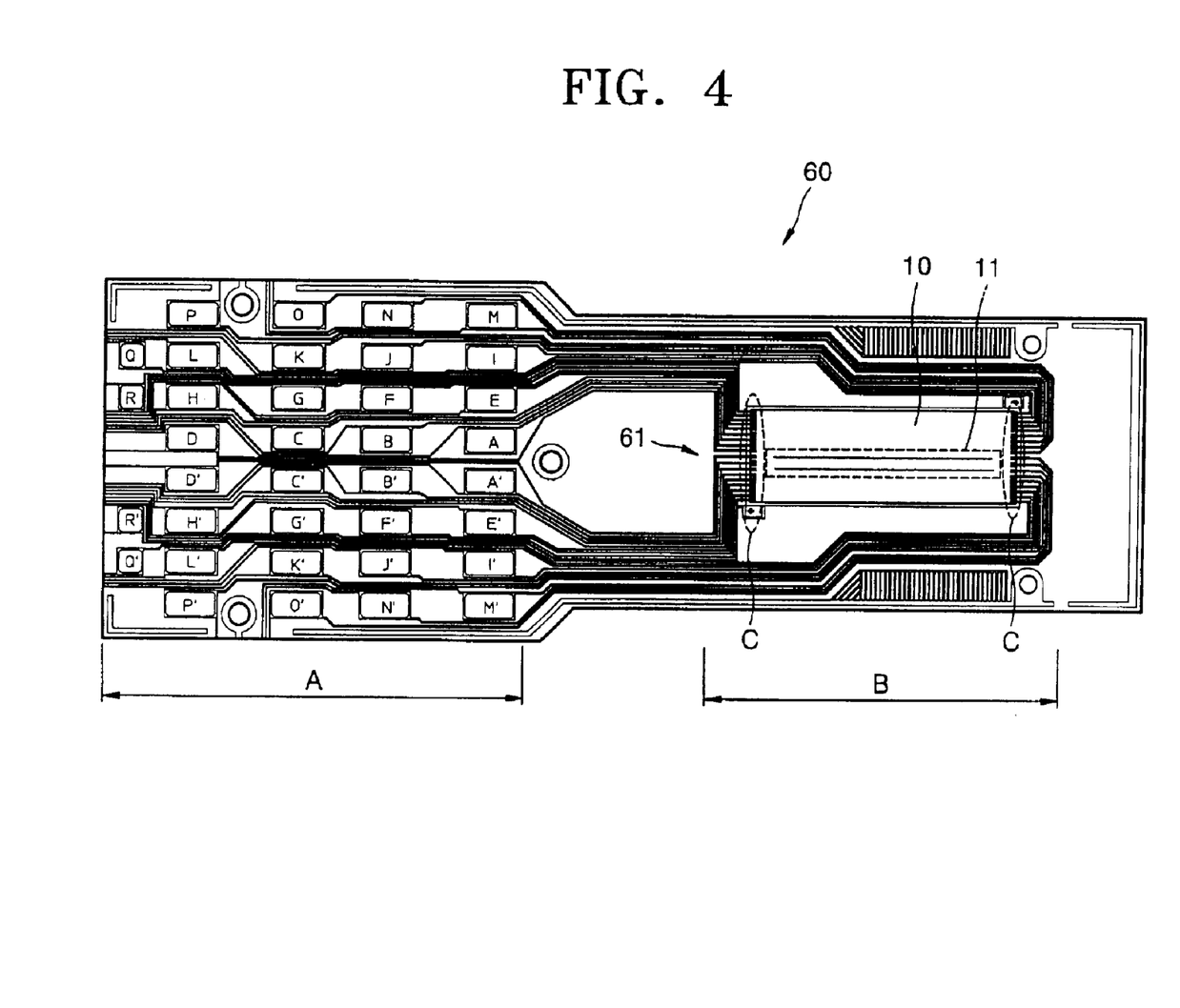
FIG. 4 is a plan view of the FPC cable used for the ink jet print head assembly.

FIG. 4 is a plan view of the FPC cable 60. The FPC cable 60 is largely divided into a pad area A having a plurality of contact pads (indicated by alphabets), which provides electrical communication access to circuits external to the print head assembly (or the cartridge), e.g., the control mechanism (not shown) of a printer, and a bonding area B where the conductors 61 to be bonded to the pads 20 of the print head die 10 of the inkjet print head are arranged. Reference numeral 11 denotes a nozzle area formed on the print head die 10. In the FPC cable 60 of FIG. 3, the bonding portions (i.e., the bonding ends) of the conductors 61 are arranged in areas C.

Referring back to FIG. 3, the bonding portions of the conductors 61 are bonded to corresponding pads 20 installed on the print head die 10. In the example shown in FIG. 3, two of the conductors 61 are shown to be bonded to two corresponding pads 20 installed on ends of the print head die 10 at a time. However, it should be apparent to and understood by those skilled in the art that any number of conductors and pads may be bonded simultaneously according to the principles of the present invention. Bonding energy is created by heat and/or pressure.

The FPC cable 60 is arranged on the print head die 10 mounted on the stage 50, such that the bonding portions of the FPC cable 60 is aligned over the pads 20 of the print head die 10. Next, the bonding tool 40 heated to a predetermined temperature performs the hot pressure welding by depressing the conductors 61 down on the pads 20 of the print head die 10 At this time, heat may also come from the stage 50, applying heat to the print head die 10 and the pads 20. This hot pressure welding is achieved within a very short period of time, in which solder (or gold) bumps disposed on the pads 20 are locally melted, and the conductor 61 and the pads 20 are thus joined together. In FIG. 3, reference numeral 42 denotes a recess formed to prevent any surface other than the tips 41 from contacting the surface of the print head die 10.

Figure 5:
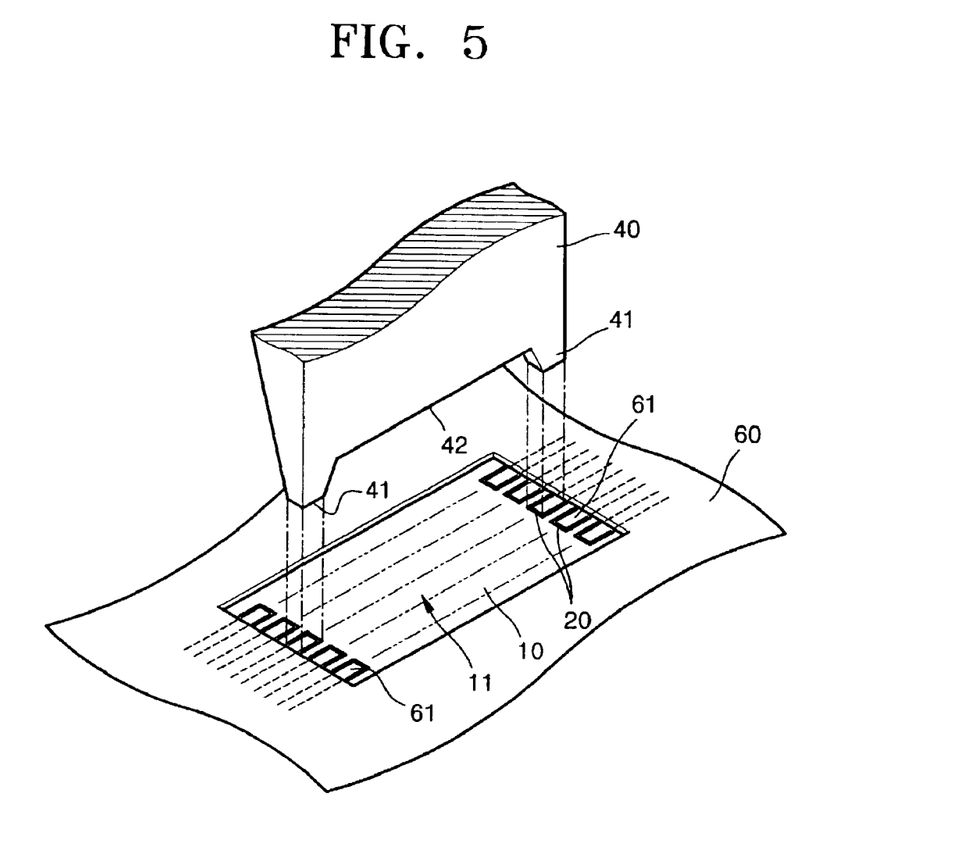
FIG. 5 is a perspective view showing a bonding manner in which two pads at one time are bonded to the FPC cable by the FPC cable bonding method of FIG. 3.
Figure 6:
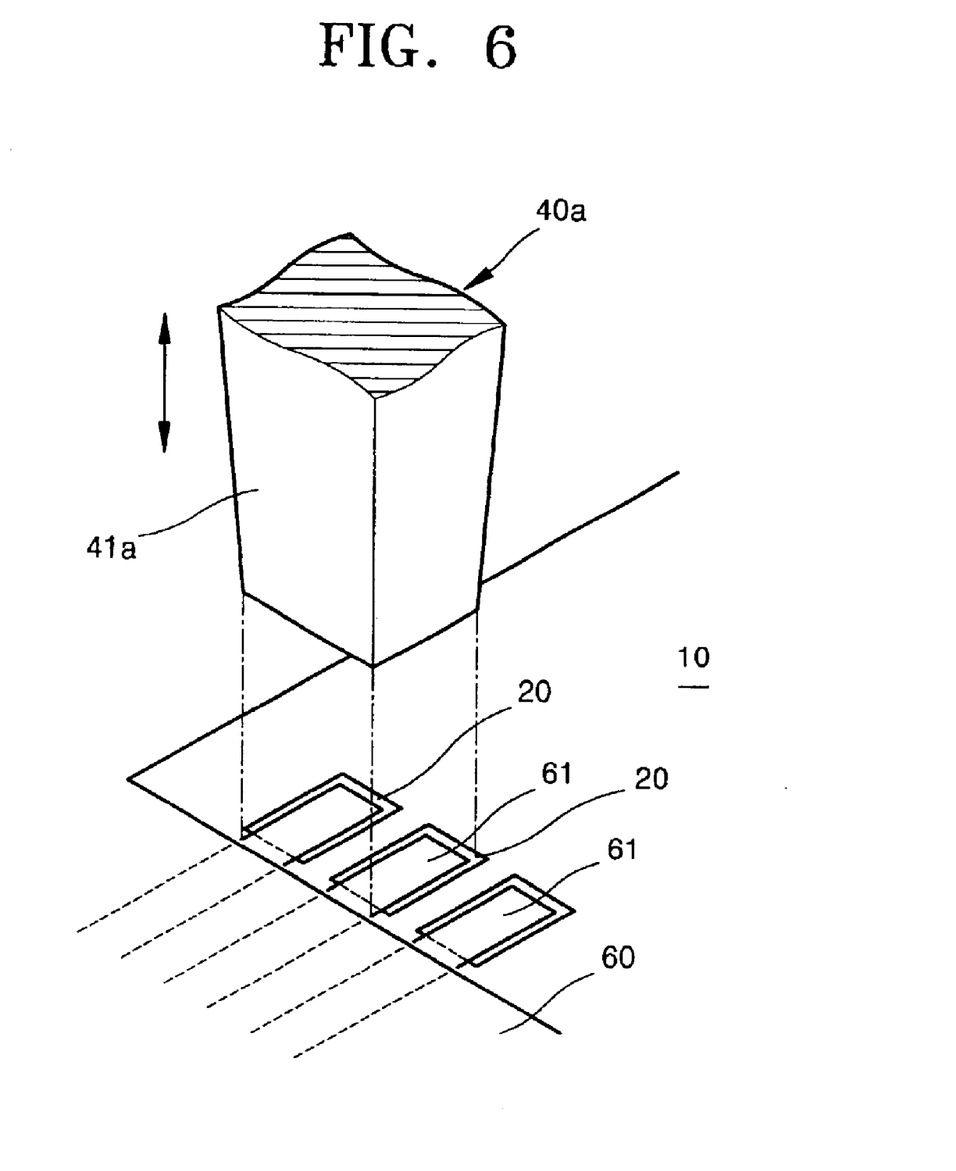
FIG. 6 is a perspective view showing a second exemplary embodiment of a method of bonding the FPC cable of the ink jet print head assembly according to the principles of the present invention.

In the embodiment shown in FIG. 3 and in FIG. 5, two conductors 61 are bonded to two pads installed on opposite ends of the print head die 10. However, as shown in FIG. 6, two adjacent pads 20 installed on the same side of a print head die may be bonded to corresponding conductors 61 by a bonding tool 40a. In the exemplary embodiment illustrated in FIG. 6, the bonding tool 40a includes a tip 41a, which may be made to traverse across the surface of the stage 50, so that the other pairs of pads 20 can also be bonded. A bonding method, according to the embodiments thus far described, provides at least two pads being bonded to corresponding conductors 61 at a time, where any at least two pads 20 can be selected. However, in a preferred embodiment, at least two pads on opposite ends of the print head die 10 are selected and bonded, as shown in FIG. 3.

Figure 7:
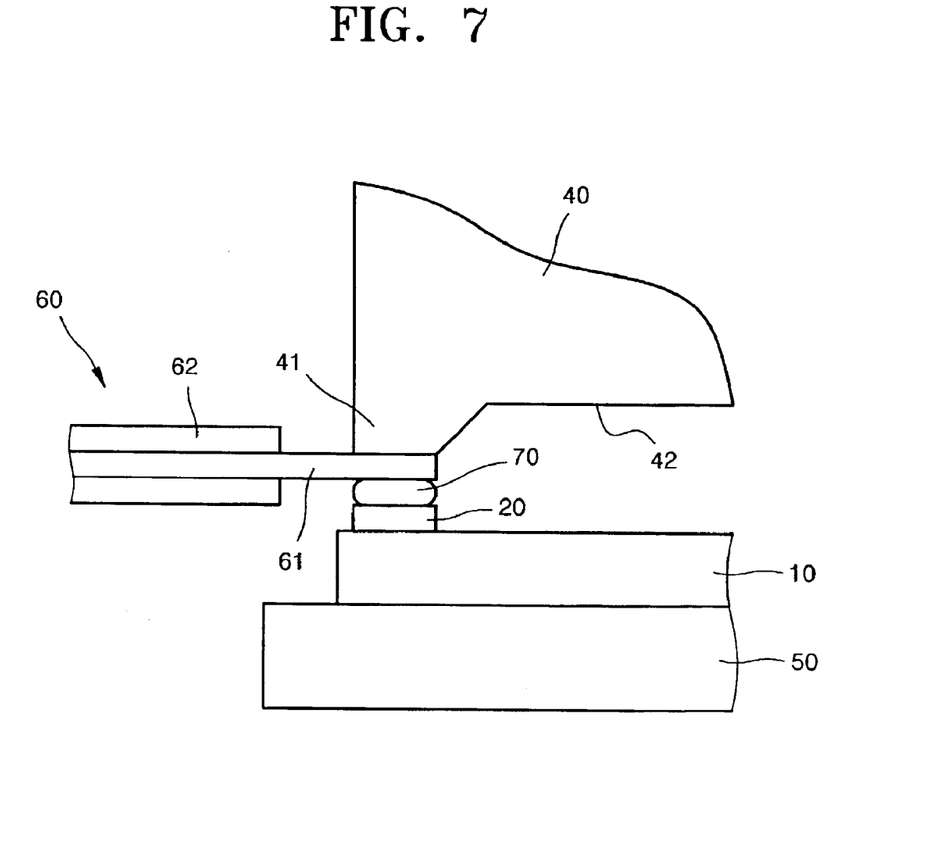
FIG. 7 is a schematic diagram illustrating a third exemplary embodiment of a method of bonding the FPC cable of the ink jet print head assembly according to the principles of the present invention.

As previously described, a conductive bump 70 is placed between the pad 20 and the conductor 61 as shown in FIG. 7. The bump 70 is made of conductive material, e.g., lead, gold, or the like. The type of conductive material of the bump 70 does not restrict the technical scope of the present invention. The bump 70 installed on the pad 20 is formed by a general method well known in the art, so the formation method will not be described.

Figure 8:
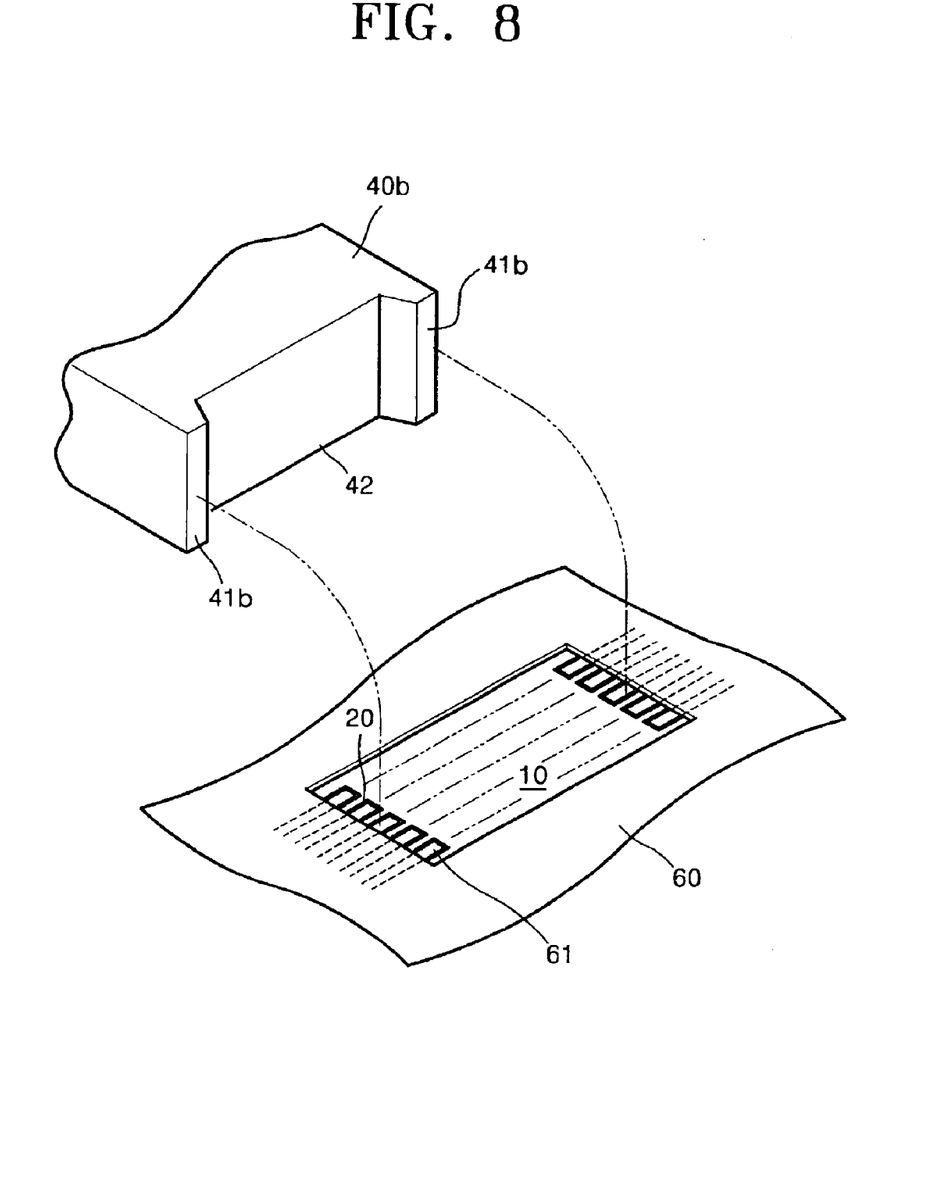
FIG. 8 is a perspective view of an exemplary embodiment of a bonding tool of the bonding apparatus, according to the principles of the present invention, illustrating a fourth exemplary embodiment of a method of bonding the FPC cable of the ink jet print head assembly according to the principles of the present invention.

In a preferred embodiment of the present invention as shown in FIG. 8, all of the pads 20 on the print head die 10 are bonded to all of the corresponding conductors 61 simultaneously. To perform the simultaneous bonding of all pads 20 (often referred to as a gang bonding process), a bonding tool 40b has a size that covers all of the pads 20 on the print head die 10, and two opposite tips 41b are formed on the bottom part of the bonding tool 40b, extending along both ends of the print head die 10. That is, the tips 41b simultaneously bond all of the pads arranged on opposite edges of the print head die 10 to corresponding conductors 61 using heat and/or pressure.

According to the principles of another aspect of the present invention, the FPC cable may be properly shaped during the bonding process. As shown in FIG. 9, the print head die 10 is mounted on the stage 50. The pad 20 is installed on the edge of the print head die 10, and the bump 70 is placed on the pad 20. An FPC cable 60a includes upper and lower protective films 62a and 62b formed on the upper and lower sides of a conductor 61, respectively. According to the principles of yet another aspect of the present invention, as shown in FIG. 9A, the FPC cable 60a has the upper protect film 62a left intact to completely cover the upper surface of the conductor 61.

Figure 9A:
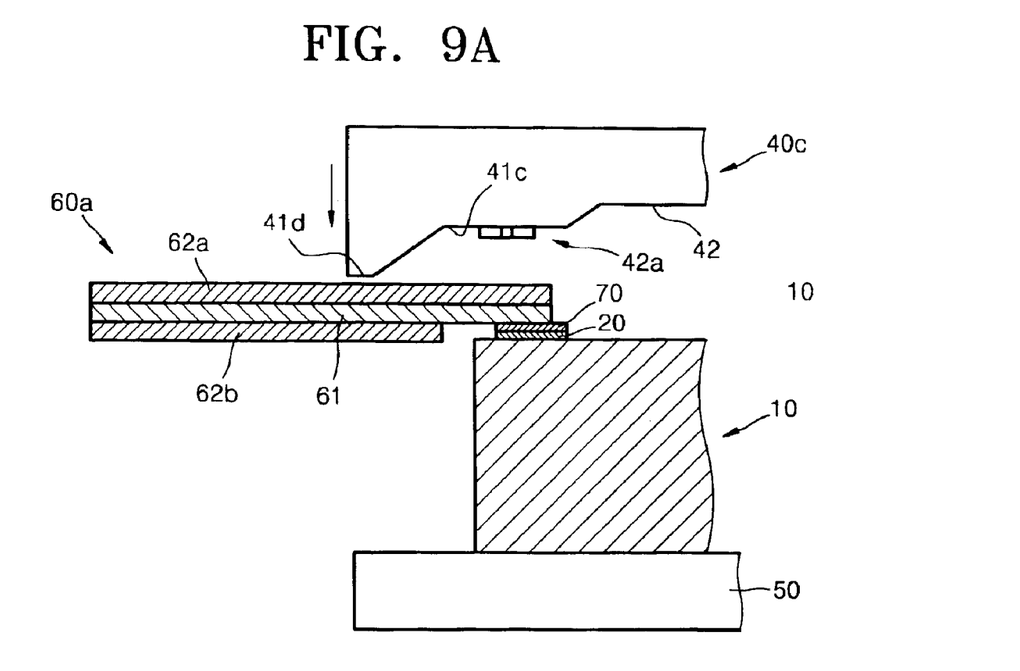
FIG. 9A is a cross-sectional diagram illustrating a fifth exemplary embodiment of a method of bonding an FPC cable to an ink jet print head assembly according to the principles of the present invention.

The bonding apparatus shown in FIG. 9A includes a bonding tool 40c that has a tip 41c and a protrusion 41d extending to beyond the peripheral edge of the print head die 10. Because the protrusion 41d extends lower than the tip 41c, the FPC cable 60a is bent downward along the outer edge of the print head die 10 during the bonding process. After the bonding process is completed, the bent portion of the FPC cable 60a remains bent, and the FPC cable 60a is thus reshaped as illustrated in FIG. 10.

Figure 9B:
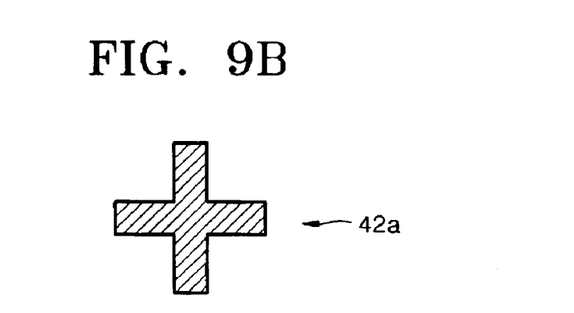
FIGS. 9B and 9C are plan views of embodiments of the partial depressing protrusion 42a of FIG. 9A.
Figure 9C:
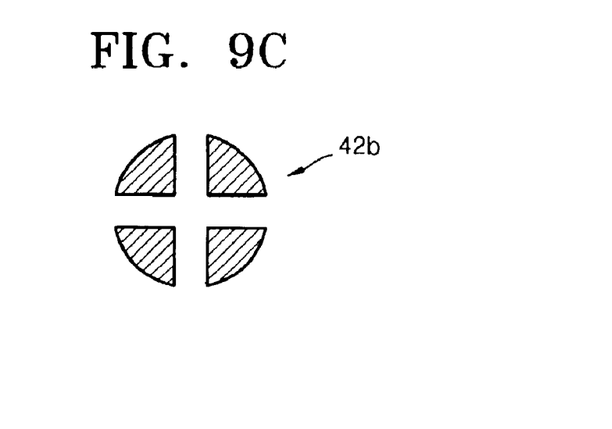

Referring again to FIG. 9A, a depressing protrusion 42a is formed on the tip 41c so as to be located directly over the pad 20. The depressing protrusion 42a increases its adhesive strength of the resulting bond. The contacting surface of the depressing protrusion 42a can have various shapes to increase the shear strength of the bond. For example, the contacting surface of the depressing protrusion 42a may have a cross (+) shape as shown in FIG. 9B, or 42b may be a circular shape outlining a cross "+"-shape as shown in FIG. 9C. It should be understood that the contacting surface of the depressing protrusion 42a may take any shape, which makes an impression through the conductor 61, the bump 70 and/or the pad 20 so as to increase the shear force there between.

Figure 10:
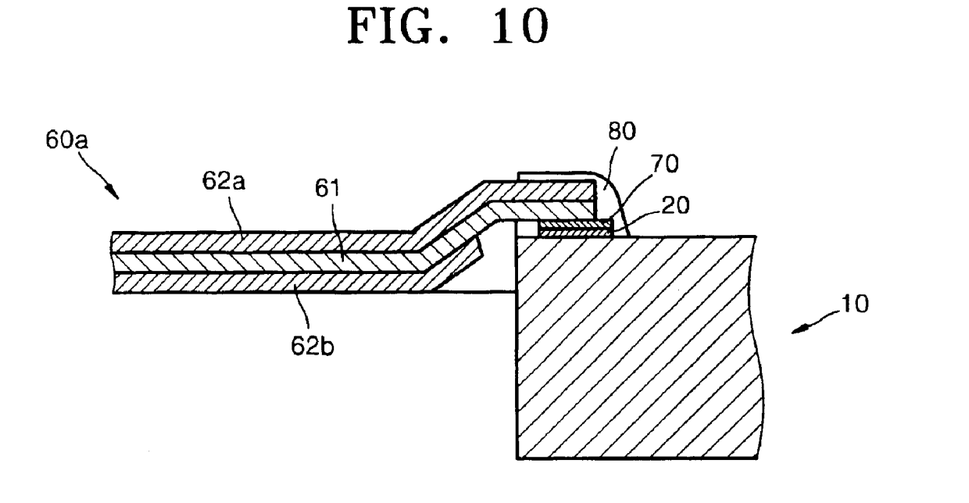
FIG. 10 is a partial cross-section of a print head die to which the FPC cable is bonded by the method of FIG. 9A.

As shown in FIG. 10, exposed portions of the conductor 61 and pad 20 are encapsulated by an insulating material, e.g., resin, forming an encapsulation 80. According to the principles of another aspect of the present invention, the upper protective film 62a remains intact, completely covering the conductor 61. A smaller amount of encapsulating (insulating) material may be used in comparison with the case where the upper surface of the conductor 61 is completely exposed. The height of the encapsulation 80 is thus shorter, which presents less of interference when the ink jet head is being wiped by a wiper of a maintenance station during a service operation of the printer.

Figure 11:
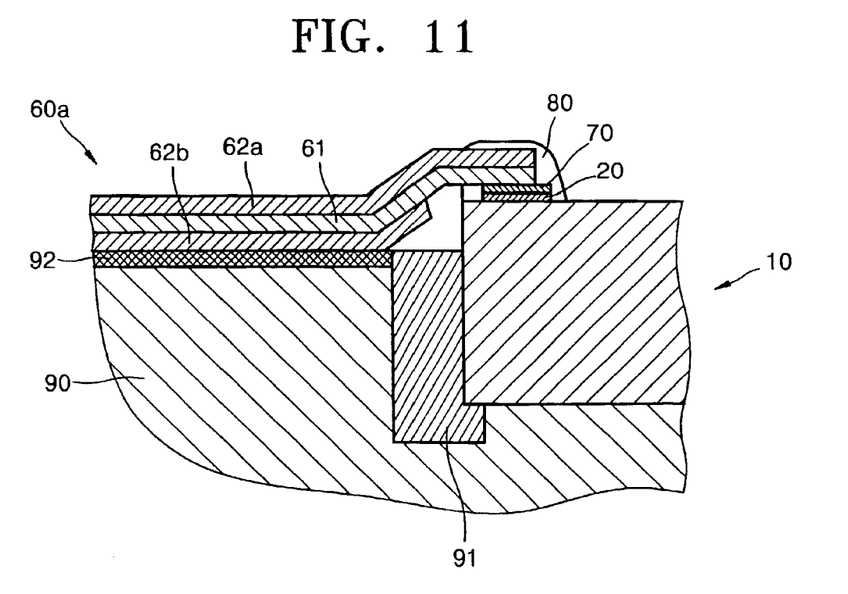
FIG. 11 is a partial cross-section of an ink jet print head assembly cartridge on which a print head die to which the FPC cable is bonded by the method of FIG. 9A is installed.

With the FPC cable 60a bent as shown in FIG. 10, the print head die 10 is mounted on an ink cartridge 90 as shown in FIG. 11, the FPC cable 60a is affixed to the upper surface of the cartridge 90, providing sufficient clearance for a wiper that wipes the nozzle area time-to-time during the operation of the printer.

In FIG. 11, reference numeral 91 denotes resin, such as epoxy, to attach the print head die 10 to the ink reservoir, and to prevent ink leakage, and reference numeral 92 denotes a double-sided tape to attach the FPC cable 60a to the cartridge 90. It can be seen that the upper surface of the conductor 61 is covered by the protective film 62a, requiring a small amount of resin to form the encapsulation 80 over only the exposed portions of the conductor 61 and the pad 20. Consequently, an encapsulation 80 is small, particularly the height thereof may have a relatively low profile over the surface of the print head die 10. Hence, the distance between the print head die 10 and a medium, such as paper, can be significantly minimized. In the conventional ink jet head, because the upper surface of a conductor is exposed, much resin enough to cover the exposed portion must be supplied, so that a relatively taller encapsulation is created, which leads to a large distance between the medium to be printed on and the surface of the print head die 10. The application of the bending of the FPC cable 60a and the low profile encapsulation 80 according to the aspects of the present invention is not limited to the thermo-pressure and/or gang bonding generally described herein, but extends to implementation during the thermo-sonic and/or sequential single bonding as well.

Figure 12:
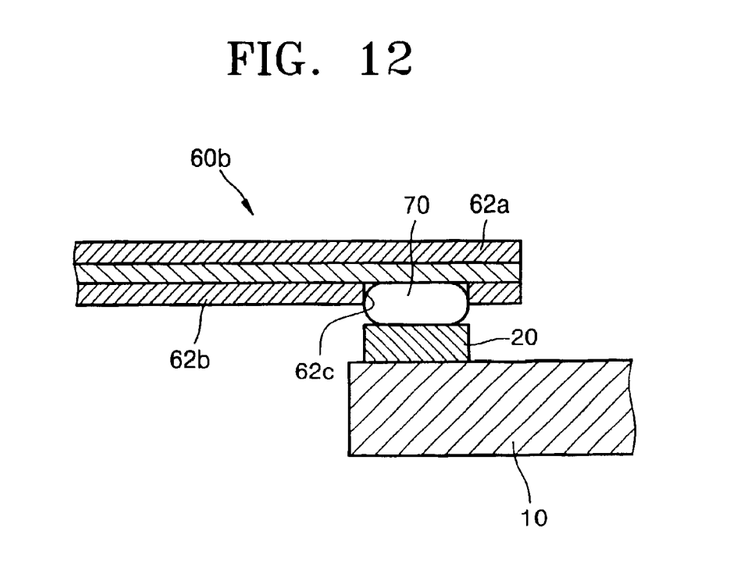
FIG. 12 is a cross-sectional view illustrating a sixth exemplary embodiment of a method of bonding the FPC cable of the ink jet print head assembly according to the principles of the present invention.

FIG. 12 shows an exemplary embodiment of a structure of an FPC cable 60b capable of being applied to any of the embodiments described herein. In FIG. 12, which shows a modification to the FPC cable 60a shown in FIGS. 9 through 11, the bonding portion of the conductor 61 is covered by the upper and lower protective films 62a and 62b. An aperture 62c is formed in the portion of the lower protective film 62b facing the pad 20. The FPC cable 60b is electrically connected to the print head die 10 via the aperture 62c by bonding the conductor 61 to the pad 20.

Preferably, the size of the aperture 62c is chosen such that the bump 70 fits completely within the aperture 62c, further reducing the amount of the encapsulation 80 required.

In one aspect of the above-described present invention, an electrical defect due to pad peel-off phenomenon caused by the ultrasonic energy in a conventional tape automated bonding (TAB) method is avoided to increase the reliability of bonding. In another aspect of the present invention, the bonding process time is minimized by bonding at least two pairs of conductors and pads at a time, and more preferably, by bonding all of the pads on the print head die at the same time, i.e., gang bonding. In an yet another aspect of the present invention, the distance between the print head die and a printing medium is reduced by reducing the distance a droplet discharged from the print head die has to travel. Thus, more stable printing quality with higher density is provided.

The many features and advantages of the invention are apparent from the detailed specification and, thus, it is intended by the appended claims to cover all such features and advantages of the invention that fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, and all such modifications and equivalents would fall within the scope of the invention.

What is claimed is:

1. A method of bonding a flexible printed circuit (FPC) cable to an ink jet print head die, said ink jet print head die having a plurality of nozzles, a plurality of resistive heaters and a plurality of interconnect pads, each of said plurality of nozzles being configured to eject an ink droplet upon activation of a corresponding one of said plurality of resistive heaters, each of said plurality of interconnect pads in electrical communication with respective corresponding one of said plurality of resistive heaters, said FPC cable having a plurality of conductors, the method comprising:

forming a bonded connection between at least one of said plurality of conductors of the FPC cable and a corresponding respective one of said plurality of interconnect pads; and bending said FPC cable such that a first portion of said FPC cable of said ink jet print head is in a first plane different from a second plane defined by a second portion of said FPC cable on said ink jet print head die.

2. The method of claim 1, wherein said step of forming said bonded connection comprises:

substantially simultaneously pressing at least two of said plurality of conductors against respective corresponding at least two of said plurality of interconnect pads; and applying heat to at least one of a first group consisting of said at least two of said plurality of conductors and a second group consisting of said at least two of said plurality of interconnect pads to form at least one pair of bonded connection between said FPC cable and said ink jet print head die.

3. The method of claim 2, wherein said step of substantially simultaneously pressing comprises substantially simultaneously pressing together all of said plurality of conductors against corresponding respective ones of said plurality of said interconnect pads.

4. The method of claim 3, wherein said step of substantially simultaneously pressing and said step of applying heat are performed substantially simultaneously.

5. The method of claim 2, wherein:

said at least one pair of bonded connections comprises a first bonded connection located near a first peripheral end of said ink jet print head die and a second bonded connection located near a second peripheral end of said ink jet print head die opposite said first peripheral end.

6. The method of claim 2, further comprising:

disposing a conductive bump between each of said at least two of said plurality of conductors and respective corresponding one said at least two of said plurality of interconnect pads.

7. The method of claim 6, wherein said step of substantially simultaneously pressing comprises applying pressure to said upper insulating layer covering said bonding portions.

8. The method of claim 6, wherein said step of removing portions of said lower insulating layer comprises cutting out has an aperture for each of said bonding portions.

9. The method of claim 8, further comprising:

disposing a conductive bump between each of said bonding portions and corresponding ones of said interconnect pads, said lower insulating layer surrounding said aperture completely enclosing said conductive bump.

10. The method of claim 1, wherein said FPC cable further comprises an upper insulating layer covering upper surfaces of said plurality of conductors and a lower insulating layer covering lower surfaces of said plurality of conductors, said method further comprising:

removing portions of said lower insulating layer to expose bonding portions on the lower surfaces of said plurality of conductors while said upper insulating layer is left intact to substantially completely cover the upper surfaces of said plurality of said conductors, each of said bonding portions facing corresponding one of said interconnect pads.

11. A method of bonding a flexible printed circuit (FPC) cable to an ink jet print head die having disposed thereon a plurality of nozzles configured to eject ink droplets and a plurality of interconnect pads for providing external control access to said plurality of nozzles, said FPC cable having a plurality of conductors, an upper insulating layer and a lower insulating layer, said plurality of conductors being disposed between said upper insulating layer and said lower insulating layer, the method comprising:

removing portions of said lower insulating layer to expose bonding portions on the lower surfaces of said plurality of conductors while said upper insulating layer is left intact to substantially completely cover the upper surfaces of said plurality of said conductors, each of said bonding portions facing corresponding one of said interconnect pads; and forming a bonded connection between at least one of said exposed bonding portions and said corresponding respective one of said plurality of interconnect pads.

12. The method of claim 11, further comprising:

bending said FPC cable such that a first portion of said FPC cable off said ink jet print head is in a first plane different from a second plane defined by a second portion of said FPC cable on said ink jet print head.

13. The method of claim 11, wherein said step of forming said bonded connection comprises:

substantially simultaneously pressing at least two of said plurality of conductors against respective corresponding at least two of said plurality of interconnect pads; and applying heat to at least one of a first group consisting of said at least two of said plurality of conductors and a second group consisting of said at least two of said plurality of interconnect pads to form at least one pair of bonded connection between said FPC cable and said ink jet print head die.

14. The method of claim 13, wherein said step of substantially simultaneously pressing comprises substantially simultaneously pressing together all of said plurality of conductors against corresponding respective ones of said plurality of said interconnect bonds.

15. The method of claim 14, wherein said step of substantially simultaneously pressing and said step of applying heat are performed substantially simultaneously.

16. The method of claim 13, wherein:

said at least one pair of bonded connections comprises a first bonded connection located near a first peripheral end of said ink jet print head die and a second bonded connection located near a second peripheral end of said ink jet print head die opposite said first peripheral end.

17. The method of claim 13, further comprising:
disposing a conductive bump between each of said at least two of said plurality of conductors and respective corresponding one said at least two of said plurality of interconnect pads.

18. The method of claim 13, wherein said step of substantially simultaneously pressing comprises applying pressure to said upper insulating layer covering said bonding portions.

19. The method of claim 11,
wherein said step of removing portions of said lower insulating layer comprises cutting out has an aperture for each of said bonding portions.

20. The method of claim 19, further comprising:
disposing a conductive bump between each of said bonding portions and corresponding ones of said interconnect pads, said lower insulating layer surrounding said aperture completely enclosing said conductive bump.

21. A bonding apparatus for bonding conductors of an FPC cable to pads of a print head die, said ink jet print head die having a plurality of nozzles, a plurality of resistive heaters and a plurality of interconnect pads, each of said plurality of nozzles being configured to eject an ink droplet upon activation of a corresponding one of said plurality of resistive heaters, each of said plurality of interconnect pads in electrical communication with respective corresponding one of said plurality of resistive heaters, said FPC cable having a plurality of conductors, the bonding apparatus comprising:
a stage having a supporting surface for supporting said print head die thereon; and
a bonding tool having at least one tip and at least one bending protrusion, said bonding tool being configured to move in a direction towards said stage to, when said plurality conductors of said FPC cable and said plurality of interconnect pads of said print head die are placed on said supporting surface of said stage in a proper corresponding alignment, cause said tip to be in a bonding position where said tip presses at least one of said plurality of conductors against corresponding at least respective one of said plurality of interconnect pads, said bending protrusion extending along said direction further than said tip, and being spaced apart from said tip so that, when said tip is in said bonding position, a distal end of said bending protrusion does not contact said print head die, and is at a location further along said direction beyond said tip.

22. The bonding apparatus of claim 21, wherein said tip comprises at least a first tip and a second tip spaced apart from each other such that, when said first tip is aligned with a first one of said plurality of interconnect pads located near a first peripheral end of said ink jet print head die, said second tip is aligned with a second one of said plurality of interconnect pads located near a second peripheral end of said ink jet print head die opposite said first peripheral end.

23. The bonding apparatus of claim 21, wherein said tip has a contacting surface that opposes said supporting surface of said stage, said contacting surface having a sufficient size to, when in said bonding position, presses at least two of said plurality of conductors against corresponding at least respective two of said plurality of interconnect pads both located near one peripheral end of ink jet print head die.

24. The bonding apparatus of claim 21, wherein said tip has a contacting surface that opposes said supporting surface of said stage, said contacting surface having one or more indentation to provide a texture such that, when in said bonding position, said texture is impressed upon at least one of said plurality of conductors.

25. An ink jet print head assembly, comprising:
an ink jet print head die having a plurality of nozzles, a plurality of resistive heaters and a plurality of interconnect pads, each of said plurality of nozzles being configured to eject an ink droplet upon activation of a corresponding one of said plurality of resistive heaters, each of said plurality of interconnect pads in electrical communication with respective corresponding one of said plurality of resistive heaters; and
a flexible printed circuit (FPC) cable having a plurality of conductors, at least one of said plurality of conductors of said FPC cable being in a bonded connection with a corresponding respective one of said plurality of interconnect pads, said FPC cable being bent such that a first portion of said FPC cable of said ink jet print head is in a first plane different from a second plane defined by a second portion of said FPC cable on said ink jet print head.

26. The ink jet print head assembly according to claim 25, wherein said FPC cable comprises an upper protective film layer and a lower protective film layer, said plurality of conductors being disposed between said upper and lower protective film layers, and said upper protective film layer completely covering an upper surface of said at least one of said plurality of conductors over said bonded connection.

27. The ink jet print head assembly according to claim 26, wherein said bonded connection is made through an aperture formed on said lower protective film layer exposing said plurality of conductors therethrough.

28. An ink jet print head assembly, comprising:
an ink jet print head die having a plurality of nozzles, a plurality of resistive heaters and a plurality of interconnect pads, each of said plurality of nozzles being configured to eject an ink droplet upon activation of a corresponding one of said plurality of resistive heaters, each of said plurality of interconnect pads in electrical communication with respective corresponding one of said plurality of resistive heaters; and
a flexible printed circuit (FPC) cable having a plurality of conductors, at least one of said plurality of conductors of said FPC cable being in a bonded connection with a corresponding respective one of said plurality of interconnect pads, said FPC cable comprising an upper protective film layer and a lower protective film layer, said plurality of conductors being disposed between said upper and lower protective film layers, and said upper protective film layer completely covering an upper surface of said at least one of said plurality of conductors over said bonded connection.

29. The ink jet print head assembly according to claim 28, wherein
said FPC cable is bent such that a first portion of said FPC cable of said ink jet print head is in a first plane different from a second plane defined by a second portion of said FPC cable on said ink jet print head die.

30. The ink jet print head assembly according to claim 29, wherein said bonded connection is made through an aperture formed on said lower protective film layer exposing said plurality of conductors therethrough.

* * * * *